(12) United States Patent
Dai

(10) Patent No.: US 7,655,363 B2
(45) Date of Patent: Feb. 2, 2010

(54) METHOD AND APPARATUS FOR SOLVING MASK PRECIPITATED DEFECT ISSUE

(75) Inventor: Yi-Ming Dai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 413 days.

(21) Appl. No.: 11/413,447

(22) Filed: Apr. 28, 2006

(65) Prior Publication Data

US 2007/0254217 A1     Nov. 1, 2007

(51) Int. Cl.
    *G02B 26/00*     (2006.01)
    *G02F 1/155*     (2006.01)
    *G03F 1/00*     (2006.01)

(52) U.S. Cl. .................. 430/5; 430/322; 134/1; 134/34; 359/266; 359/296

(58) Field of Classification Search .......... 134/1, 134/34; 359/266, 296; 430/5, 322
See application file for complete search history.

(56) References Cited

U.S. PATENT DOCUMENTS

| 6,247,599 | B1* | 6/2001 | Cheng et al. ............ 206/723 |
| 6,421,113 | B1* | 7/2002 | Armentrout .............. 355/75 |
| 2003/0207182 | A1* | 11/2003 | Shirasaki ................. 430/5 |
| 2005/0191563 | A1 | 9/2005 | Dai et al. |

* cited by examiner

*Primary Examiner*—Mark F Huff
*Assistant Examiner*—Caleen O Sullivan
(74) *Attorney, Agent, or Firm*—Haynes and Boone, LLP

(57) ABSTRACT

Disclosed are a method and an apparatus for solving mask precipitated defect issue. A gas is purged into a photomask reticle assembly for diffusing precipitated defects out of a photomask in the photomask reticle assembly. A metal shielding assembly enclosing the photomask reticle assembly is provided for reducing precipitated defects and damages to the photomask. In an illustrative embodiment, the metal shielding assembly comprises an upper metal shielding, a pellicle frame of the photomask reticle assembly, side support frames of the photomask reticle assembly, a top cover, a handle, and a handle cover.

17 Claims, 4 Drawing Sheets

US 7,655,363 B2

METHOD AND APPARATUS FOR SOLVING MASK PRECIPITATED DEFECT ISSUE

CROSS-REFERENCE

The present disclosure is related to the following commonly-assigned U.S. Patent Applications, the entire disclosures of which are hereby incorporated herein by reference: 1) U.S. patent application Ser. No. 11/079,617 filed Mar. 14, 2005: and 2) U.S. patent application Ser. No. 10/787,698 filed Feb. 26, 2004.

BACKGROUND

The present disclosure relates in general to semiconductor manufacturing technology, and more particularly, to reducing or solving precipitate defects associated with photolithography photomasks.

Photomasks, or reticles, are commonly used for photolithography in semiconductor manufacturing. Photomasks are typically made from very flat pieces of quartz or glass with a layer of chromium deposited on one side. The pattern being used to transfer an image to a wafer on BIM or PSM masks during a photolithography processing. While contamination of photomasks has always been a problem, high precision masks, such as are used in photolithography having wavelengths equal to or less than 248 nm, are particularly susceptible to defects.

One type of photomask contamination is referred to as haze contamination. Haze contamination is a precipitant formed from mask cleaning chemical residual or impurity of fab or tool environment cross exposure. For example, when a solution including ammonium (NH4) and sulfate (SO4) is used to clean a photomask, contamination becomes apparent when the photomask is exposed to a short wavelength UV light, such as 248 or 193 nm. Haze contamination maybe isolated by purging the photomasks with a general gas, such as nitrogen or clean dry air. Purging typically involves diffusing the gas into a reticle pod via a gas inlet and diffusing impurity materials, such as ammonium and sulfate, out of the reticle pod.

Photomasks also suffer from other defects, such as those caused from electrostatic discharge (ESD). ESD can damage the pattern on the photomasks, resulting in a defected image produced on the wafers.

Therefore, a need exists for a method and an apparatus that minimizes haze contamination. Also, a need exists for a method and an apparatus that reduce damages of photomasks due to ESD.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
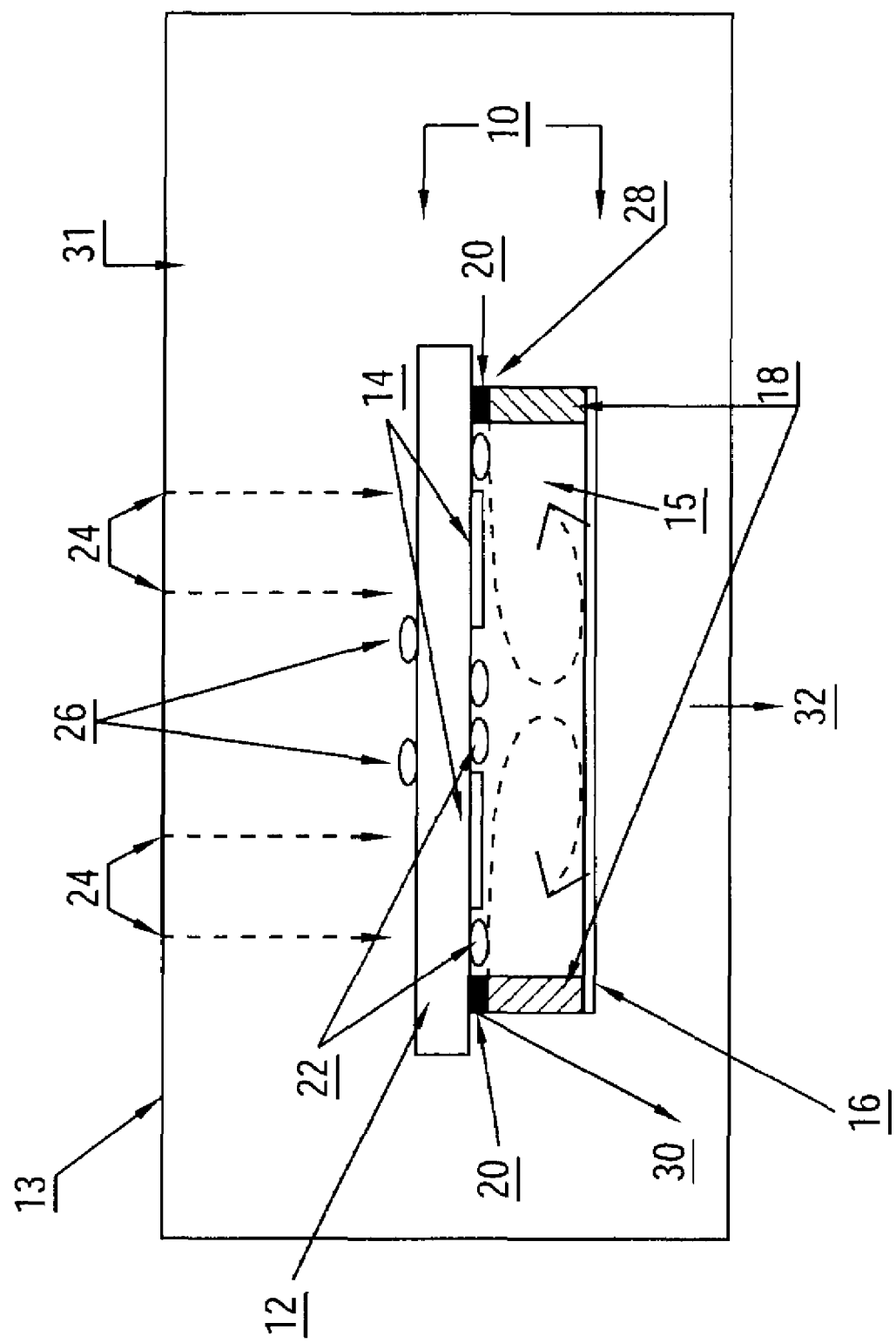
FIG. 1 is a diagram of a reticle assembly for purging a photomask.

It is to be understood that the following disclosure provides different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

FIG. 1 is a diagram of a reticle assembly for purging a photomask. As shown in FIG. 1, reticle assembly 10 includes a transparent reticle blank 12 with a reticle pattern 14 adhered to one side. The reticle pattern 14 is configured to be projected and exposed onto a semiconductor wafer. In addition, the reticle assembly 10 includes a pellicle frame 16 that covers the reticle pattern 14, and side support frames 18 that are attached to the outer edges of the reticle blank 12. The side support frames 18, the frame 16, and the reticle blank 12 form a chamber 15. The side support frames 18 are attached using a glue or frame adhesive 20. The reticle assembly 10 is enclosed within a storage structure known as a reticle pod 13.

Currently, precipitated defects may be caused by airborne contamination from the environment, pellicle glue, reticle pod out-gassing, pellicle frame residue, chemical growth and deposition from the reactions, and mixing of chemical solutions. When the reticle pattern 14 is cleaned with a solution based on chemicals such as ammonium and sulfate, residual ions may be trapped inside the chamber 15 near the reticle pattern 14. For example, precipitated defects 22 may be grown and deposited onto the reticle pattern 14. In addition, as the reticle is continuously used in the photolithography process, energy from a light source may accelerate the growth of precipitated defects. For example, with a UV light source 248 of 193 nm wavelength, precipitated defects 26 can grow and/or deposit upon or near the reticle pattern 14.

In order to minimize the growth and deposition of precipitated defects, a gas inlet 28 and a gas outlet 30 are used to allow particle movement within the chamber 15. The gas inlet 28 and the gas outlet 30 can be formed in the frame adhesive 20, be adjacent to the frame adhesive, or be in other location along the reticle pod 13.

An inert gas, such as inert gas nitrogen, oxygen or argon, is allowed to diffuse into the reticle pod 13 through gas inlet 31, thereby creating a positive pressure flow in the pod. The positive pressure flow allows the inert gas to diffuse into the chamber 15 through the gas inlet 28. The inert gas then interacts with any impurity materials 22 inside the chamber 15, such as ammonium and/or sulfate, which then diffuse out of the chamber 15 through the gas outlet 30. The impurity materials can further diffuse out of the reticle pod 13 through gas outlet 32. By purging the reticle pod 13 with a gas, precipitated defects 22, such as $(NH4)_2SO_4$, diffuse out of the reticle pod 13. While purging minimizes the growth of the precipitated defects, photomasks still suffer from electrostatic discharge (ESD), which damages photomasks that are printable on the wafer.

Figure 2:
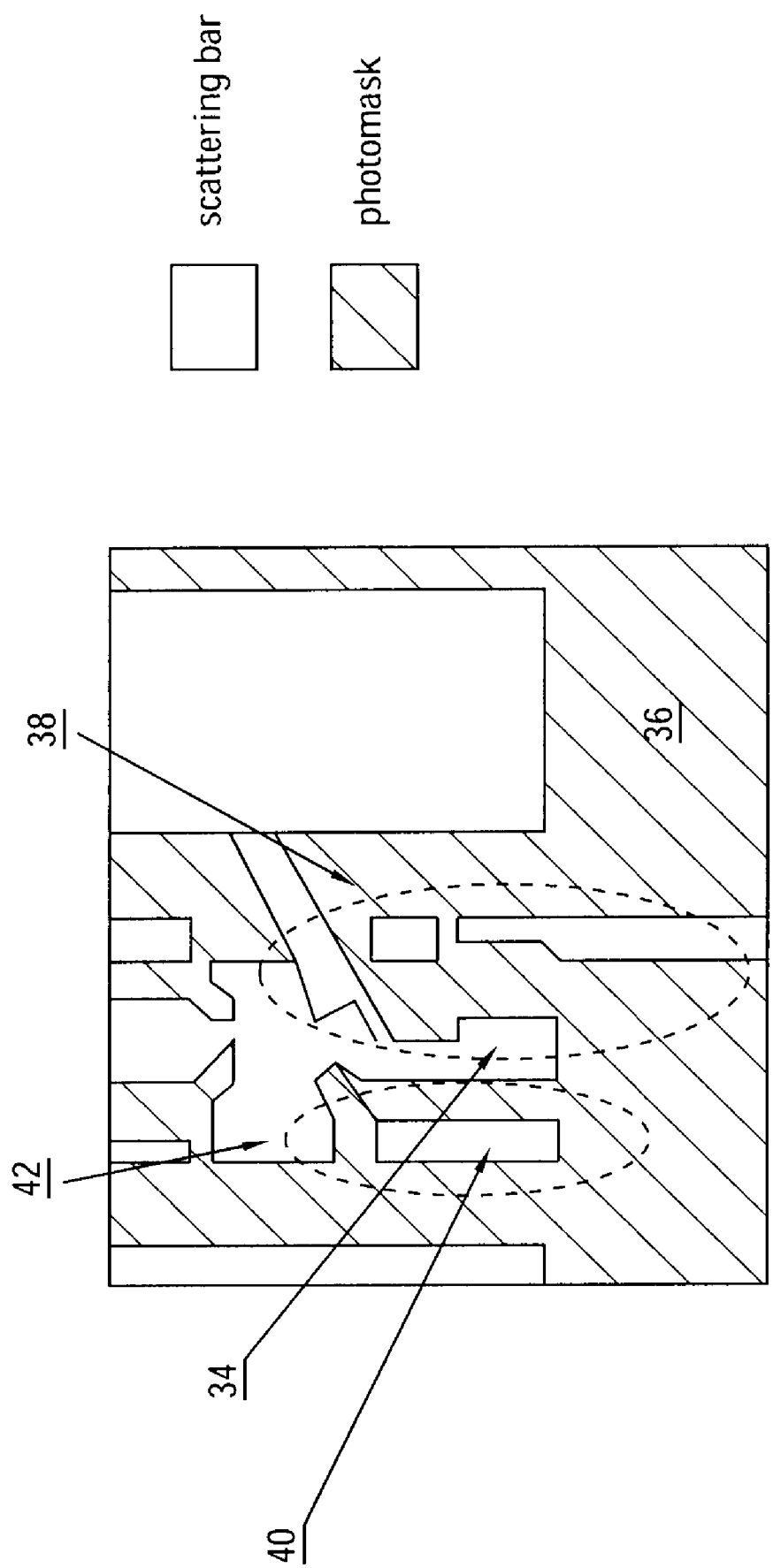
FIG. 2 is a diagram of exemplary ESD damages suffered by photomasks.

FIG. 2 is a diagram of exemplary ESD damages suffered by photomasks. Scattering bars 34 of a reticle pattern, as shown in white, in area 38 of photomask 36 suffer ESD damage. This is compared to scattering bars 40 of a reticle pattern, also shown in white, in area 42 of photomask 36, which suffer no ESD damage. The ESD damaged area 38 is printable on the wafers that photomask 36 produces.

Figure 3:
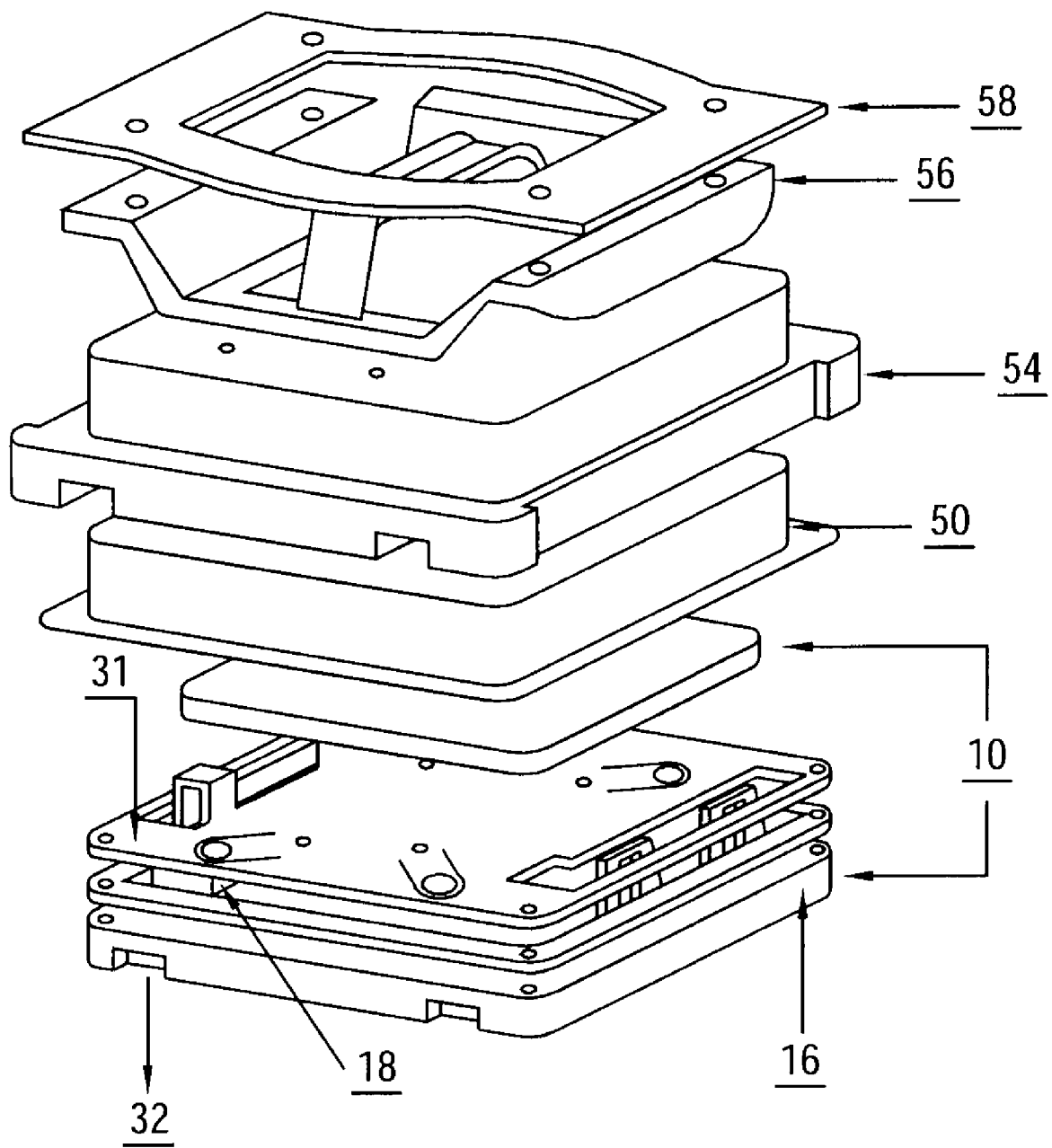
FIG. 3 is a reticle pod with new metal shielding.

Referring now to FIG. 3, in order to reduce ESD damages and further minimize precipitated defects, a new metal shielding is provided by the present disclosure. The metal shielding assembly comprises an upper and lower metal shielding 50, a pellicle frame 16, and side support frames 18 of the reticle assembly 10. The metal shielding assembly may be made of any metal, such as alloy and stainless steel. In order to allow purging of the photomasks to occur, the metal shielding assembly comprises a gas inlet 31 and a gas outlet 32.

In an illustrative embodiment, the reticle assembly 10 comprising the pellicle frame and the side support frames, and the upper and lower metal shielding 50 are all enclosed by a top cover 54, which protects the entire reticle structure. Similar to the metal shielding, top cover 54 may also be made of any metal, such as alloy and stainless steel. A handle assembly is attached to top cover 54, such that the top cover 54 may easily be removed to replace the reticle 12 of the reticle assembly 10. In the present embodiment, the handle assembly comprises a handle 56 and a handle cover 58. The handle assembly may also be made of any metal, such as alloy and stainless steel.

Figure 4:
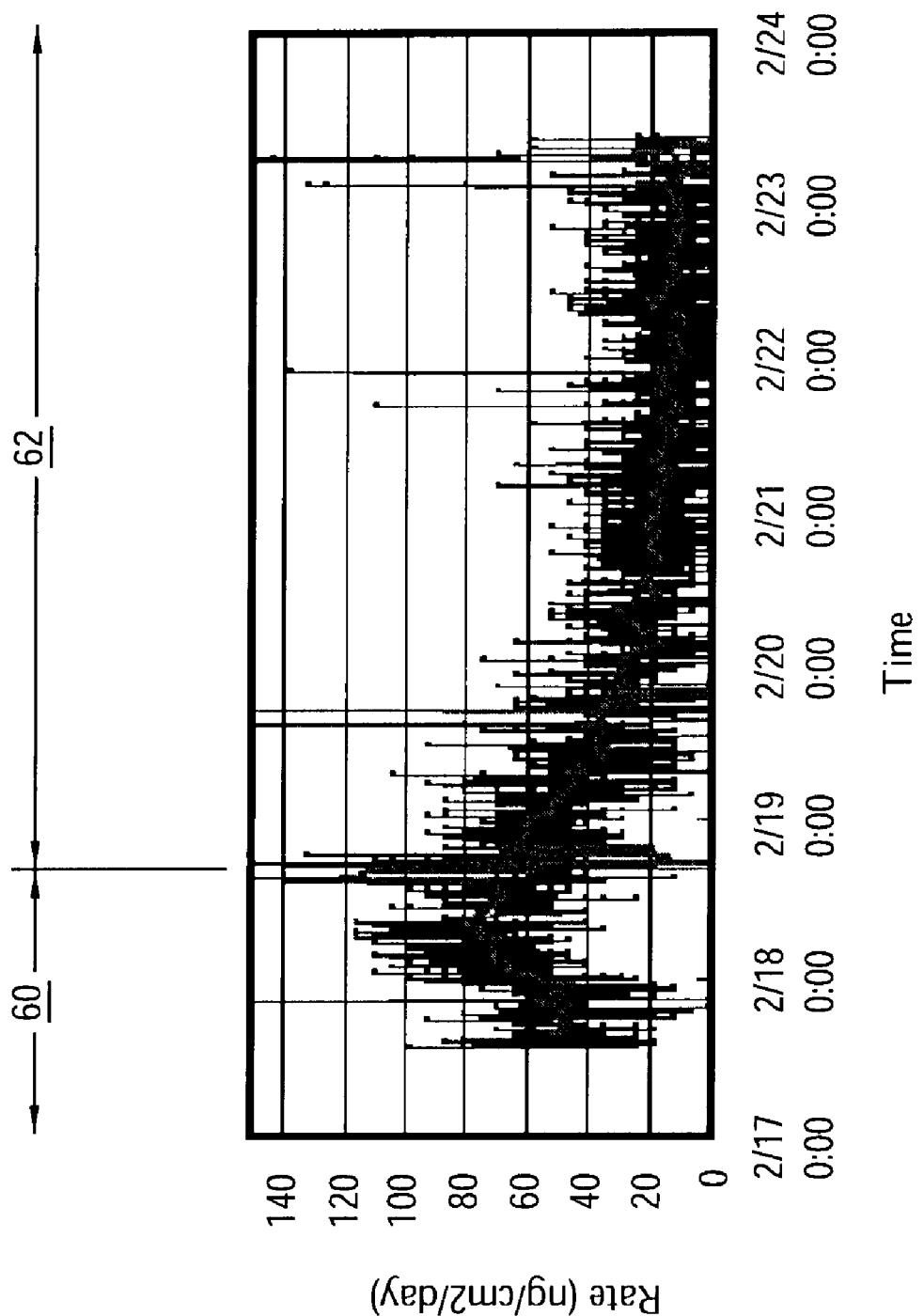
FIG. 4 is a graph of the diffusion rate of sulfuric gas in mini environment over a period of time.

In addition to purging, by having the reticle assembly 10 fully shielded by metal, the growth and deposition of precipitated defects, such as sulfate, may be further minimized. FIG. 4 is a graph of the diffusion rate of sulfuric gas in mini environment over a period of time. As shown in FIG. 4, the Y-axis represents a diffusion rate of total sulfuric gas in a unit of ng/cm2/day. The X-axis represents a period of time in a unit of 24 hours. In this example, the diffusion rate of total sulfuric gas increases during time period 60, in which the reticle assembly 10 is enclosed not by metal shielding, but by a non-metallic material such as polymer. Subsequently, the diffusion rate of total sulfuric gas decreases in a steady rate during time period 62, in which the reticle assembly 10 is enclosed by metal shielding. Thus, the growth and deposition of precipitated defects decrease as a result of the introduction of metal shielding.

In addition, the number of wafers produced by a photomask with both purging and metal shielding is much higher than the number of wafer produced by a photomask with purging only. For example, 28000 wafers are produced by a photomask with both purging and metal shielding compared to 1500 to 2000 wafers produced by a photomask with purging only. Because of their metallic nature, the upper and lower metal shielding 50, the pellicle frame 16, and the side support frames 18 help in reducing ESD damage. The reduction in ESD damage increases the lifetime of the photomasks, and thus increases photomask productivity. In one example, 18000 wafers are produced by a photomask with metal shielding compared to 1150 wafers produced by a photomask without metal shielding.

In summary, the combination of purging and metal shielding helps in solving precipitated defect issues by minimizing the growth and deposition of impurities and preventing ESD damage. As a result, the mask repeating effect, the mask cleaning frequency, and the dimension-on-mask loss after mask cleaning are reduced. In addition, since more wafers can be produced from the same mask, mask productivity is increased and less masks are required to be reworked.

What is claimed is:

1. A method of reducing defects in a photomask arranged within a photomask reticle assembly, the method comprising:
   providing a shielding assembly fully enclosing the photomask reticle assembly for reducing precipitated defects to the photomask, wherein the shielding assembly comprises an airtight seal and a gas inlet and a gas outlet;
   diffusing a gas into the photomask reticle assembly via the gas inlet;
   purging precipitated defects out of a photomask with the diffused gas via the gas outlet.

2. The method of claim 1, wherein the photomask reticle assembly comprises a reticle blank, a reticle pattern adhered to one side of the reticle blank, a pellicle frame covering the reticle pattern, and side support frames attached to outer edges of the reticle blank by frame adhesive.

3. The method of claim 1, wherein the gas is at least one of a nitrogen, an oxygen and an argon.

4. The method of claim 2, wherein the shielding assembly comprises an upper shielding, the pellicle frame of the photomask reticle assembly, and the side support frames of the photomask reticle assembly.

5. The method of claim 4, wherein the upper shielding, the pellicle frame of the photomask reticle assembly, and the side support frames of the photomask reticle assembly are made of at least one of an alloy and a stainless steel.

6. The method of claim 4, wherein the shielding assembly further comprises a top cover enclosing the upper shielding and the photomask reticle assembly.

7. The method of claim 6, wherein the top cover is made of at least one of an alloy and a stainless steel.

8. The method of claim 6, wherein the shielding assembly further comprises a handle assembly attached to the top cover.

9. The method of claim 7, wherein the handle assembly comprises a handle and a handle cover.

10. The method of claim 9, wherein the handle and the handle cover are made of at least one of an alloy and a stainless steel.

11. A photomask reticle assembly comprising:
    a photomask disposed within the photomask reticle assembly, wherein the photomask reticle assembly comprises at least one gas inlet through which a gas is diffused into an interior of the photomask reticle assembly and towards the photomask;
    a shielding assembly enclosing the photomask reticle assembly, the shielding assembly configured for reducing precipitated defects and damages to the photomask, wherein the shielding assembly comprises an airtight seal, a gas inlet for diffusing gas into the shielding assembly and a gas outlet for purging precipitated defects out of the photomask with the diffused gas.

12. The photomask reticle assembly of claim 11, wherein the photomask comprises a reticle blank and a reticle pattern adhered to at least one side of the reticle blank, and wherein the assembly further comprises:
    a pellicle frame covering the reticle pattern, and side support frames attached to outer edges of the reticle blank by frame adhesive.

13. The photomask reticle assembly of claim 12, further comprising at least one gas outlet through which precipitated defects are diffused out from the interior of the photomask reticle assembly responsive to the gas being diffused into the interior of the assembly.

14. The photomask reticle assembly of claim 12, wherein the shielding assembly comprises an upper shielding, the pellicle frame of the photomask reticle assembly, and the side support frames of the photomask reticle assembly.

15. The photomask reticle assembly of claim 12, wherein the shielding assembly further comprises a top cover enclosing the upper shielding and the photomask reticle assembly.

16. The photomask reticle assembly of claim 15, wherein the upper shielding, the pellicle frame of the photomask reticle assembly, the side support frames of the photomask reticle assembly, the top cover, the handle, and the handle cover are made of at least one of an alloy and a stainless steel.

17. A reticle pod for use in photolithography, the pod comprising:
- a reticle assembly including a patterned reticle and a chamber configured to encase a surface of the patterned reticle, the chamber including a gas inlet and a gas outlet; and
- a casing surrounding the reticle assembly, the casing comprising an airtight seal and including at least one gas inlet through which a gas is diffused into the casing, and at least one gas outlet through which a gas is diffused out of the casing;
- wherein the casing further includes a conductive member surrounding at least a portion of the reticle assembly, the conductive member being configured to reduce electrostatic discharge ("ESD") defects in the reticle assembly.

* * * * *